United States Patent [19]

Azumai

[11] Patent Number: 5,198,757
[45] Date of Patent: Mar. 30, 1993

[54] METHOD AND APPARATUS FOR TESTING SEMICONDUCTOR INTEGRATED CIRCUIT

[75] Inventor: Hideo Azumai, Toyonaka, Japan

[73] Assignee: Megachips Corporation, Osaka, Japan

[21] Appl. No.: 731,975

[22] Filed: Jul. 18, 1991

[30] Foreign Application Priority Data

May 15, 1991 [JP] Japan .................................. 3-141101

[51] Int. Cl.$^5$ ............................................ G01R 31/00
[52] U.S. Cl. .................................. 324/158 R; 324/73.1; 371/15.1
[58] Field of Search .................... 324/158 R, 73.1; 371/15.1, 25.1, 16.1, 22.1, 226, 27; 340/825.79

[56] References Cited

U.S. PATENT DOCUMENTS

| | | | |
|---|---|---|---|
| 4,749,947 | 6/1988 | Gheewala | 340/825.79 |
| 4,975,640 | 12/1990 | Lipp | 324/73.1 |
| 5,065,090 | 11/1991 | Gheewala | 324/73.1 |

FOREIGN PATENT DOCUMENTS 1-179338 7/1989 Japan .

Primary Examiner—Vinh Nguyen
Attorney, Agent, or Firm—Evenson, Wands, Edwards, Lenahan & McKeown

[57] ABSTRACT

An apparatus for testing a semiconductor integrated circuit by using probe lines and sense lines, has a selection device for applying a selective signal in sequence to one of the probe lines, and electronic switch devices incorporated in the integrated circuit so that the electronic switch devices and intersections, where the probe lines and sense lines intersect each other, are in one-to-one correspondence and the electronic switch devices can feed signals to their corresponding sense lines in response to selective signals applied to the probe lines. Each electronic switch device is connected to test points in the integrated circuit and connected to its corresponding sense line. Many level quantization devices are provided for generating many-level quantized signal, corresponding to one of combinations of binary signals on the test points connected to the electronic switches of each electronic switch device, to its corresponding sense line, and two-level quantization devices convert the many-level quantized signal, generated on each sense line, to reproduced binary signals corresponding to the one of combinations of the binary signals on the test points.

13 Claims, 7 Drawing Sheets

FIG. 8 [Prior Art]
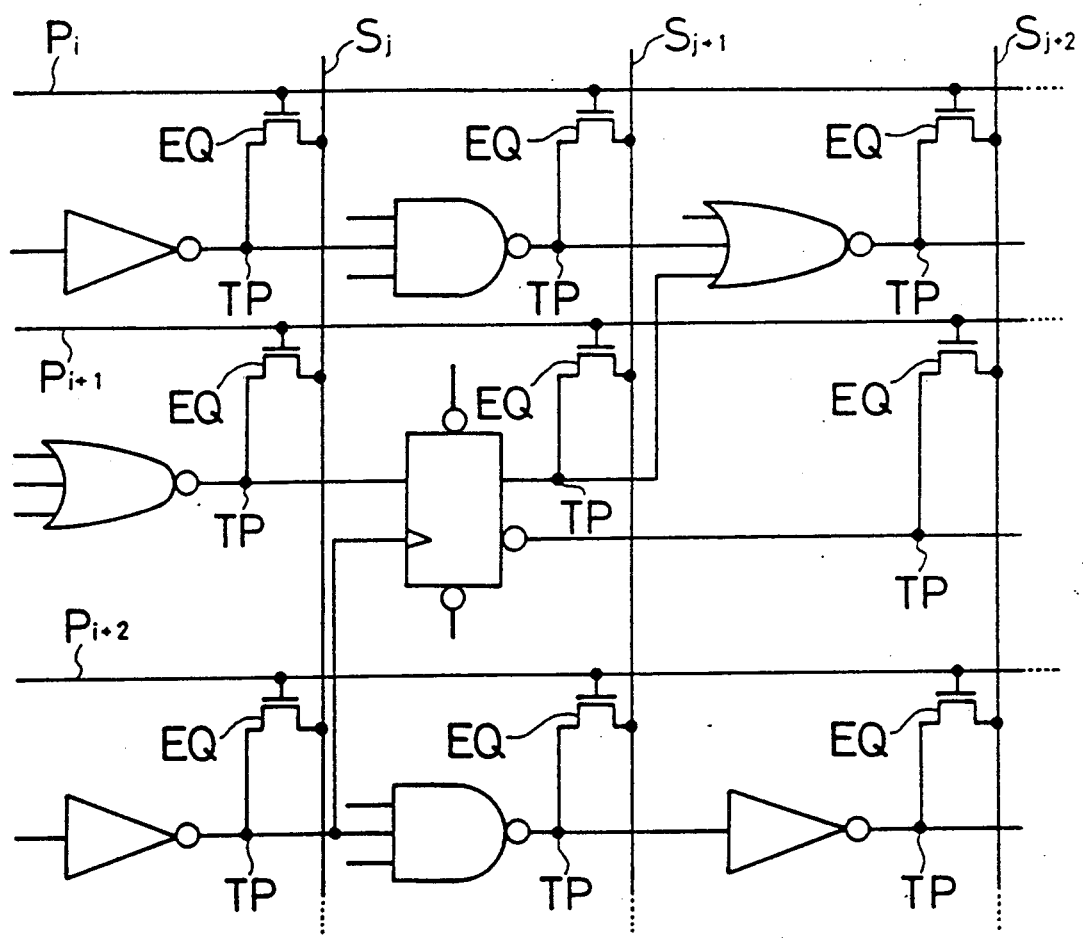

METHOD AND APPARATUS FOR TESTING SEMICONDUCTOR INTEGRATED CIRCUIT

BACKGROUND OF THE INVENTION

The present invention relates to a method and apparatus for testing a semiconductor integrated circuit and more particularly to a technique for testing the integrated circuit through probe lines and sense lines, which are incorporated in the integrated circuit so as to intersect (but be electrically separated from) each other at right angles.

In general, the known Scan-Path method and the Cross-Check method have been employed to test whether a large number of logic elements (logic gates) incorporated in an integrated circuit function normally or not.

In the Scan-Path method, test pattern signals are applied in sequence to an integrated circuit, and then output pattern signals from the integrated circuit are observed to detect faults of the logic elements.

Recently, the number of logic elements incorporated in integrated circuits has been increasing rapidly due to the continuing progress of integration technology, so that the testing cost of the Scan-Path method has become expensive because it requires long test time and much labor. In addition, this method requires a large number of flip-flops to be incorporated in the integrated circuit.

Japanese Patent Laid-open Publication No. 1-179,338 discloses a technique for testing an integrated circuit by the Cross-Check method. In this testing technique, as shown in FIG. 8 as an example, a large number of probe lines $P_i$, $P_{i+1}$, $P_{i+2}$, each of which corresponds to each row of an array of logic elements such as NAND, NOR, INVERTER, and D-F/F, and a large number of sense lines $S_j$, $S_{j+1}$, $S_{j+2}$, each of which corresponds to each column of an array of logic elements, are incorporated in the integrated circuit so as to intersect each other at right angles, and each logic element is disposed so as to correspond to one of intersections where the probe lines $P_i$, $P_{i+1}$, $P_{i+2}$ and the sense lines $S_j$, $S_{j+1}$, $S_{j+2}$ intersect each other.

A test point TP of each logic element is connected to its corresponding sense line through an electronic switch EQ consisting of a MOSFET, and each electronic switch EQ is turned ON by applying a selection signal to the corresponding probe line.

For example, in a state of one of test pattern signals being applied to the integrated circuit by applying a selection signal of "one" level to the probe line $P_i$, the electronic switches EQ connected to the probe line $P_i$ are turned ON, and then test signals at the test points TP of an INVERTER, NAND, NOR, etc., are fed to the sense lines $S_j$, $S_{j+1}$, $S_{j+2}$, respectively. Next, by applying the selection signal to the probe line $P_{i+1}$, test signals at the test points TP of NOR, D-F/F, etc., are fed to the sense lines $S_j$, $S_{j+1}$, $S_{j+2}$, respectively. In this manner, by applying the selection signal to the other probe lines in sequence, all logic elements are tested with regard to the one of test pattern signals. Then, another test pattern signal is applied to the integrated circuit, and the same steps as above-described are carried out, and by applying all test pattern signals in sequence to the integrated circuit, all logic elements are tested with regard to all test patterns signals.

It is to be noted that the above-described testing technique requires a large number of probe lines to be incorporated and sense lines in an integrated circuit so that test points correspond, respectively, to intersections where probe lines and sense lines intersect. In other words, if a matrix structure of logic elements, or a matrix structure of test points, consists of X rows and Y columns, it is required to incorporate X probe lines and Y sense lines in an integrated circuit. In order to incorporate such a large number of probe lines and sense lines, integration density of the integrated circuit has to be undesirably reduced; therefore, testing apparatus according to this testing technique can not be practical and economical.

SUMMARY OF THE INVENTION

In testing a semiconductor integrated circuit through plural probe lines and plural sense lines incorporated in an integrated circuit, an object of the present invention is to provide a method and an apparatus for testing the semiconductor integrated circuit which are capable of testing reliably functions of a large number of logic elements thereof without reducing its integration density.

In order to achieve the above object, the apparatus for testing a semiconductor integrated circuit according to the present invention comprises a selection device for applying a selection signal to one of the probe lines in sequence, plural electronic switch devices incorporated in the integrated circuit so that the electronic switch devices correspond plural intersections, respectively, where the probe lines and the sense lines intersect each other. Each of the electronic switch devices is connected to plural test points in the integrated circuit, and a plural state indicating analog signal generating devices are provided for generating "many-level quantized signals", i.e. state indicating analog signals, each of which corresponds to a combination of binary signals on the test points connected to the electronic switch device, to their corresponding sense lines, respectively, and plural two-level quantization devices are provided for converting each of the state indicating analog signals generated on the sense lines, into reproduced binary signals corresponding to the combinations of the binary signals on corresponding test points.

When the selection signal is applied to one of the probe lines, state indicating analog signals, corresponding to combinations of binary signals on the test points connected to the electronic switch devices corresponding to the selected probe line, are generated on sense lines by the many-level quantization devices. Then the state indicating analog signals generated on sense lines are converted into reproduced binary signals corresponding to the combination of the binary signals on the test points by the two-level quantization devices.

According to the apparatus for testing the integrated circuit of the present invention, plural test points correspond to one intersection, thereby substantially reducing the number of probe lines and sense lines.

BRIEF DESCRIPTION OF DRAWINGS

FIG. 8 is a circuit diagram showing an example of the electronic switch device of prior art.

DETAILED DESCRIPTION OF THE PREFERRED EMBODIMENTS

A method and apparatus for testing a semiconductor integrated circuit according to the embodiment shown in FIGS. 1-5 are applied to a general purpose semiconductor integrated circuit.

Figure 1:
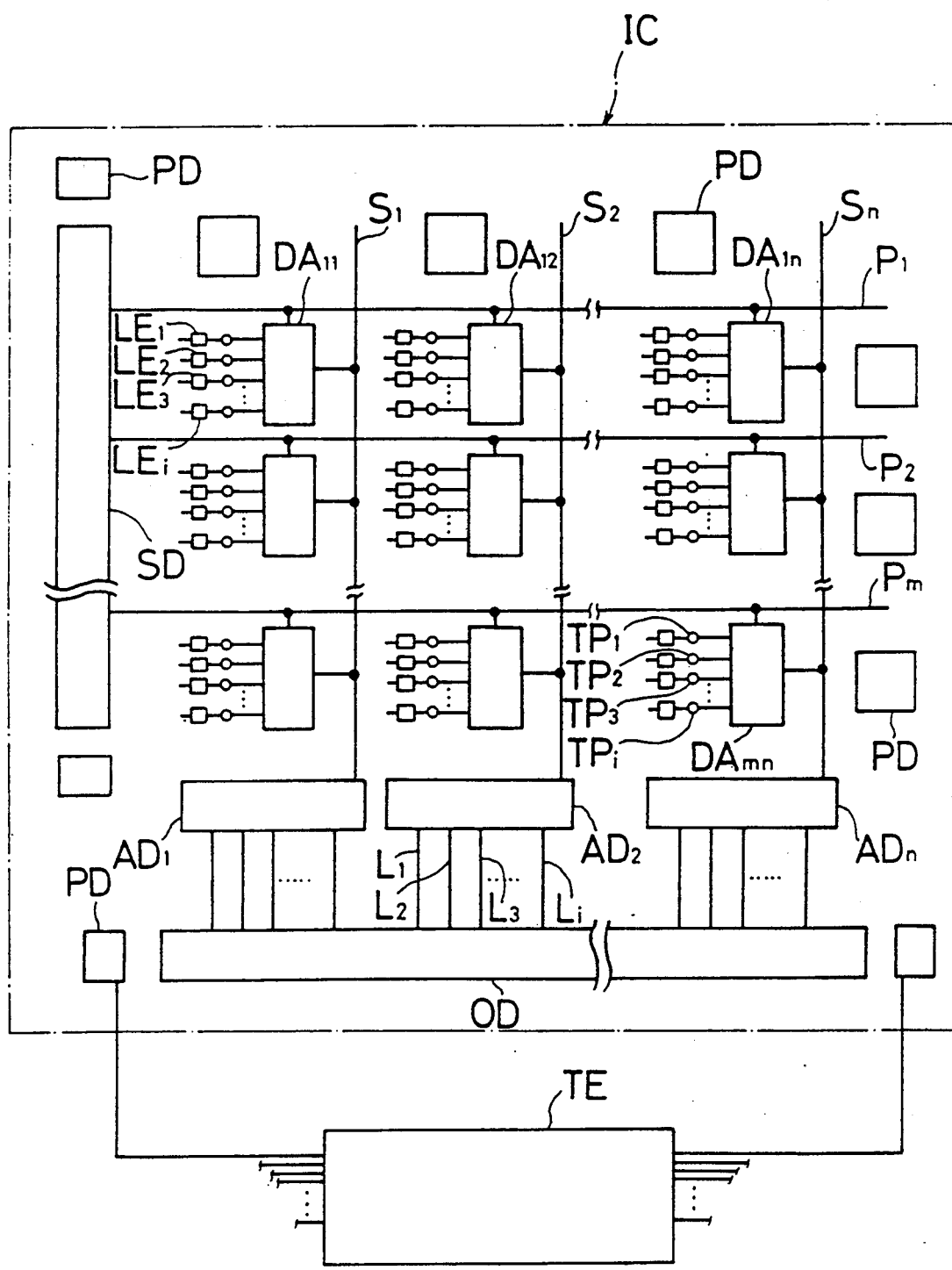
FIG. 1 is a diagram showing a basic configuration of a testing apparatus for a semiconductor integrated circuit.

Firstly, the basic configuration of the testing apparatus will be described. As shown in FIG. 1, the testing apparatus has m probe lines $P_1 \sim P_m$ (hereinafter, denoted by P) and n sense lines $S_1 \sim S_n$ (hereinafter, denoted by S) intersecting the probe lines P at right angles, which are incorporated in the integrated circuit IC in which logic elements $LE_1 \sim LE_1$ (hereinafter, denoted by LE) of various functions are interconnected to each other. A selection device SD is disposed at the marginal portion of the integrated circuit IC and connected to each probe line P. Additionally, m×n electronic switch devices $DA_{11} \sim DA_{mn}$ (hereinafter, denoted by DA) are incorporated in the integrated circuit IC so as to correspond to intersections, respectively, where the probe lines P and the sense lines S intersect each other. Two level quantization devices $AD_1 \sim AD_n$ (hereinafter, denoted by AD) are disposed at the marginal portion of the integrated circuit IC and connected at their inputs to the sense lines S, respectively. An observation device OD disposed at the marginal portion of the integrated circuit IC and connected to the two-level quantization devices AD. An electronic apparatus TE for testing is disposed outside of the integrated circuit IC and connected to pads PD formed at the marginal portion of the integrated circuit IC through its probes.

Each electronic switch device DA includes, i electronic switches EQ, which constitute an electronic switch group G, connected to test points $TP_1 \sim TP_1$ (hereinafter, denoted by TP) on the output lines of i logic elements LE respectively, and i selection switches SQ connected to the electonic switches EQ with one-to-one correspondence and also connected to the corresponding probe line P and corresponding sense line S, respectively.

The selection device SD applies a "one" level selection signal to one of the probe lines P in sequence for turning ON the selection switches SQ of the electronic switch devices DA connected to the probe line P being applied the selection signal. As will be described hereinafter, when the selection signal is applied to the probe lines P, state indicating analog signal corresponding to a combination of binary signals on the test points TP of the logic elements LE connected to the selected probe line P through the electronic switch device DA, is generated on each sense line S. Each two-level quantization device AD converts the state indicating analog signal generated on the sense line S, to which the device AD is connected, into the same binary signals as the original binary signals on i test points TP in each group, and is connected to the observation device OD through i output lines $L_1 \sim L_i$ (hereinafter, denoted by L), which correspond respectively to i test points TP connected to i electronic switches EQ of the electronic switch group G. I reproduced binary signals reproduced by each two-level quantization device AD are fed to the observation device OD through corresponding output lines L, respectively.

The observation device OD is for storing the reproduced binary signals temporarily and for feeding them at predetermined timing to the electronic apparatus TE.

The electronic apparatus TE is electrically connected to the input terminals of the logic elements LE of input portion of the integrated circuit IC, to the selection device SD, and to the observation device OD, by contacting its probes with the pads PD formed in the integrated circuit IC, and applies various known test pattern signals to the integrated circuit IC and applies various data and clock signals to the selection device SD and observation device OD. Furthermore, it analyzes the reproduced binary signals fed from the observation device OD and the output signals fed from the output pad PD to observe whether the integrated circuit IC operates normally or not, to identify defective logic elements LE, and to evaluate the performance of the integrated circuit IC. The electronic apparatus TE includes, a pattern signal generator, a timing signal generator, a control unit, memories, formatters, etc. Since it is a similar type as of known apparatuses for testing an integrated circuit, the detailed description on the apparatus TE will be omitted.

In addition, the selection device SD and the observation device OD can be constituted by logic elements LE incorporated in the integrated circuit IC.

Figure 2:
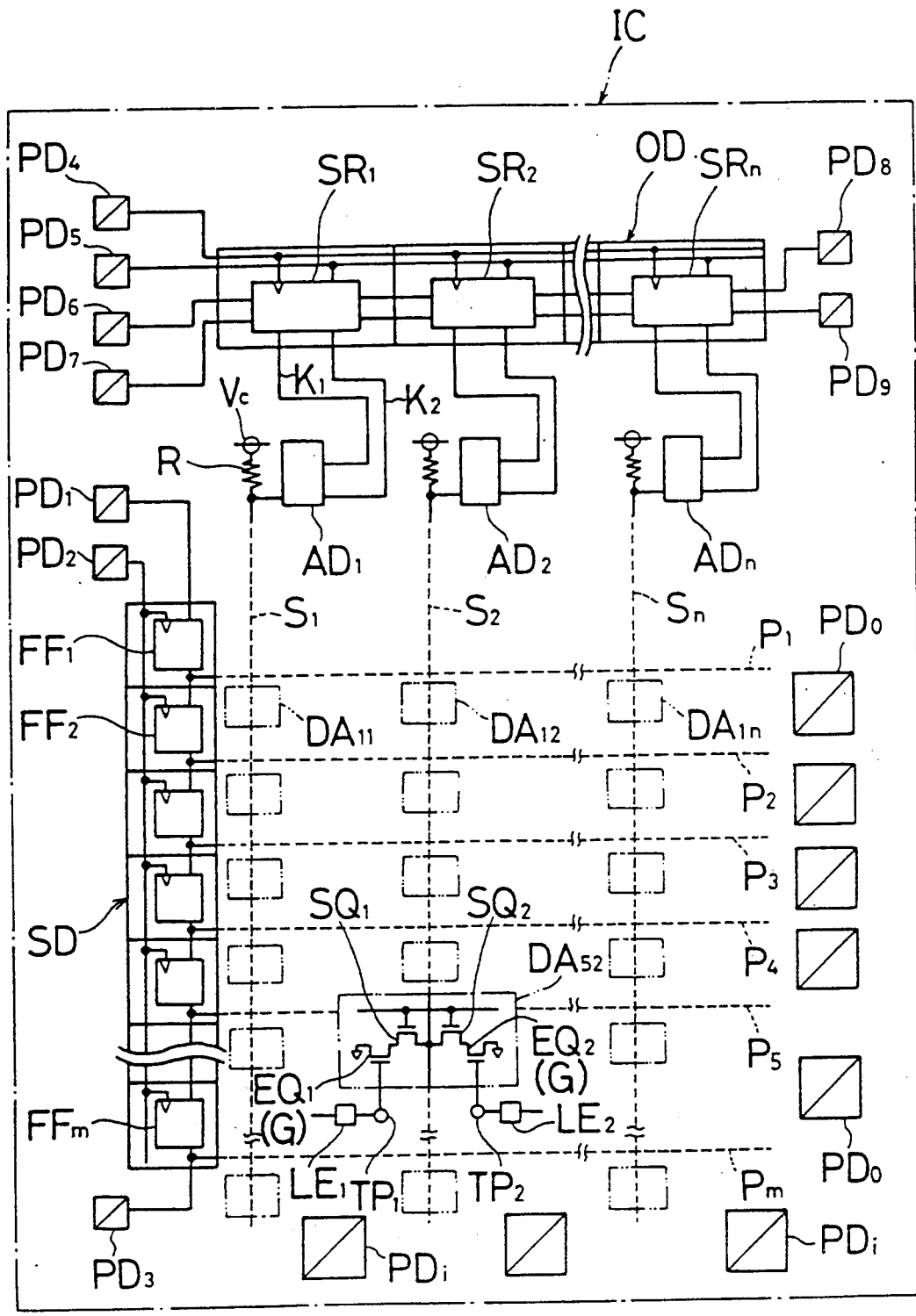
FIG. 2 is a detailed circuit diagram of the testing apparatus in FIG. 1.

Next, descriptions will be made on an example of the detailed structure of the testing apparatus with reference to FIG. 2. In the following descriptions, the number of test points TP connected to each electronic switch group G is two.

Electronic switch devices DA are disposed so that electronic switch devices DA corresponds respectively to intersections, where the m probe lines P and the n sense lines incorporated in an integrated circuit IC intersect each other, with one-to-one correspondence. Each electronic switch device DA includes, two electronic switches $EQ_1$, $EQ_2$ constituting an electronic switch group G and consisting of n-channel MOSFETs connected to test points $TP_1$, $TP_2$ on output lines of logic elements $LE_1$, $LE_2$, respectively, and two selection switches $SQ_1$, $SQ_2$ consisting of n-channel MOSFETs connected to the electronic switches $EQ_1$, $EQ_2$, respectively.

A selection device SD for applying a selection signal to the probe lines P comprises a shift register including m D-type flip-flops $FF_1 \sim FF_m$ connected in series, and each of two-level quantization devices AD connected to the sense lines S, respectively, comprises a 2-bits A/D converter. In addition, in order to generate a state indicating analog signal corresponding to a combination of the binary signals on the test points $TP_1$, $TP_2$ connected respectively to the electronic switches $EQ_1$, $EQ_2$ of each electronic switch group G, in co-operation with the electronic switches $EQ_1$, $EQ_2$ and the selection switches $SQ_1$, $SQ_2$, each sense line S is connected to a constant-voltage supply source V of the integrated circuit IC through a register R.

The observation device OD comprises n 2-bits serial/parallel type shift registers $SR_1 \sim SR_n$ (hereinafter, denoted by SR) connected in series, and each two-level quantization device AD and corresponding sift register SR is connected through two output lines $K_1$, $K_2$ corresponding to the test points $TP_1$, $TP_2$, respectively.

The selection device SD is connected to pads $PD_1$, $PD_2$, to which control data and clock signals from the electronic apparatus TE are applied, respectively, and also connected to a pad $PD_3$ for feeding the control data to the electronic apparatus TE. The observation device OD is connected to pads $PD_4 \sim PD_7$, to which clock signals from the apparatus TE, mode setting signals for setting each shift register SR to be serial or parallel mode and observation data for testing are applied, respectively, and also connected to pads $PD_8$, $PD_9$ for feeding reproduced binary signals to the electronic apparatus TE.

In testing the integrated circuit IC, in the case where the selection signal for selecting the probe line P is a "one" level and non-selection signal for not selecting the probe line P is a "zero" level, all probe lines P are first initialized by applying the non-selection signals, and then one of the test pattern signals is applied to the circuit IC from the electronic apparatus TE through the input pads $PD_1$. Next, when the first rising of the clock signal applied from the pad $PD_1$ takes place, the control data of the "one" level is applied to the selection device SD to apply the selection signal to the probe line $P_1$, so that the selection switches $SQ_1$, $SQ_2$ connected to the probe line $P_1$ are turned ON by the selection signal. At this time, state indicating analog signals corresponding to combinations of binary signals on the test points $TP_1$, $TP_2$ are generated from each of n electronic switch groups G corresponding to the probe line $P_1$ on the corresponding sense lines S, respectively. Then, each state indicating analog signal generated on the corresponding sense line S is reproduced to the same binary signals as the original binary signals on the test points $TP_1$, $TP_2$ by the two-level quantization device AD corresponding to the sense line S. Then the reproduced binary signals are fed to the corresponding shift register SR of the observation device OD through the output lines $K_1$, $K_2$ corresponding to the test points $TP_1$, $TP_2$, respectively. The reproduced binary signals fed from each two-level quantization device AD are stored temporarily in the observation device OD, and then fed to the electronic apparatus TE from the observation device OD at predetermined timing.

Next, the selection signal is applied to the next neighboring probe lines P from the probe line $P_1$ in sequence by applying the control data of the "zero" level to the selection device SD at each timing of the rising of the clock signal, so that the selection signal is applied to the probe line $P_m$ at the time of rising of mth clock signal. In this manner, the selection signal is applied to other probe lines P sequentially, and generating of the state indicating analog signals on the sense lines S, reproducing of the binary signals, feeding of the reproduced binary signals to the observation device OD, and feeding of the reproduced binary signals to the electronic apparatus TE are carried out in sequence repeatedly as above-described.

After completing the testing with regard to one of the test pattern signals, another test pattern signal is selected, then the testing is carried out through all probe lines P similarly by repeating above-described steps, and the testing is carried out with regard to all test pattern signals by repeating above-described steps.

When the selection signal is applied to the probe line $P_5$ of probe lines P, for example, a state indicating analog signal corresponding to one of four combinations of binary signals of "one" or "zero" level on the test points $TP_1$, $TP_2$ is generated on the sense line $S_2$, for example, through the constant-voltage supply $V_c$, the registor R, the selection switches $SQ_1$, $SQ_2$ and the electronic switches $EQ_1$, $EQ_2$, and then the state indicating analog signal is applied to the two-level quantization device $AD_2$. The state indicating analog signal is reproduced to the same binary signals as the original binary signals on the test points $TP_1$, $TP_2$ by the two-level quantization device $AD_2$, then the reproduced binary signals are fed to the corresponding shift register $SR_2$ of the observation device OD through the output lines $K_1$, $K_2$ corresponding to the test points $TP_1$, $TP_2$, respectively. Similarly, in parallel with the foregoing the binary signals on the test points $TP_1$, $TP_2$ of the other groups connected to the probe line $P_5$ through the other electronic switch devices DA are converted into state indicating analog signals, reproduced by the corresponding two-level quantization devices AD, and then fed to the observation device OD, respectively.

The N groups of reproduced binary signals fed from each two-level quantization device AD to the observation device OD are stored in the observation device OD at the time when each shift register SR of the observation device OD is set to parallel mode by the mode setting signal and the first rising of the clock signal applied from the pad $P_4$ takes place. Then, after each sift register SR is set to serial mode by the mode setting signal, the reproduced binary signals are fed to the electronic apparatus TE in sequence from the sense line $S_n$ to the neighboring sense line S through the pads $PD_8$, $PD_9$ each time when the clock signal is applied to the observation device OD.

Next, detailed descriptions will be made on an example of combinations of binary signals on test points TP and state indicating analog signals generated on a sense line S, with reference to FIG. 3 and FIG. 4. The following descriptions will be made on the state indicating analog signals generated on the sense line $S_2$ by applying the selection signal to the probe line $P_5$.

Figure 3:
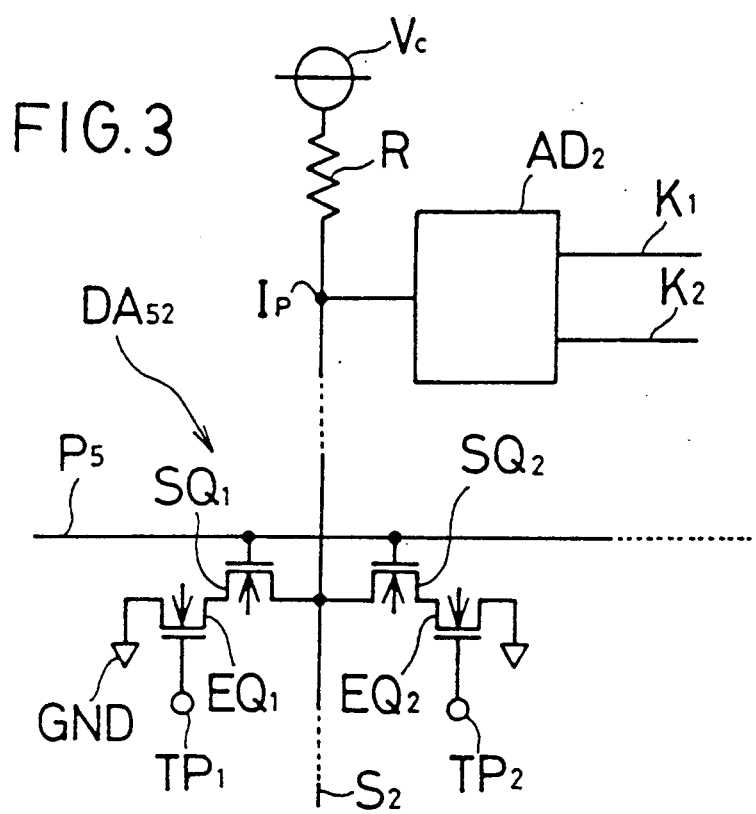
FIG. 3 is a circuit diagram showing the connection of an electronic switch device and two-level quantization device.
Figure 4:
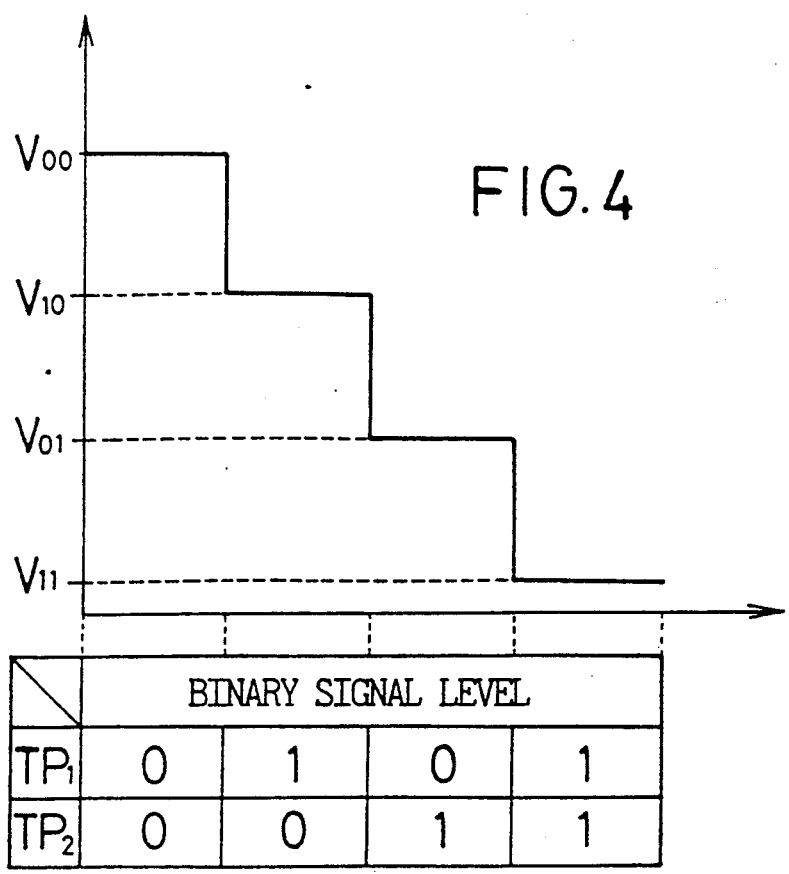
FIG. 4 is a diagram showing an example of state indicating analog signals fed to a sense line.

As shown in FIG. 3, the electronic switch device $DA_{52}$, which is disposed so as to correspond to an intersection where the probe line $P_5$ and the sense line $S_2$ intersect each other, includes electronic switches $EQ_1$, $EQ_2$ consisting of a n-channel MOSFET, respectively and connected to test points $TP_1$, $TP_2$, respectively, and selection switches $SQ_1$, $SQ_2$ consisting of a n-channel MOSFET, respectively and connected to the electronic switches $EQ_1$, $EQ_2$, respectively. Drains, sources and gates of the electronic switches $EQ_1$, $EQ_2$ are connected to the corresponding test points $TP_1$, $TP_2$, a ground GND of the integrated circuit IC and the sources of the corresponding selection switches $SQ_1$, $SQ_2$, respectively, and gates and drains of the selection switches $SQ_1$, $SQ_2$ are connected to the probe line $P_5$ and sense line $S_2$, respectively. By connecting the electronic switches $EQ_1$, $EQ_2$ and the selection switches $SQ_1$, $SQ_2$ in this manner, when a selection signal of "one" level is not applied to the probe line $P_5$, the selection switches $SQ_1$, $SQ_2$ are not turned ON, and therefore the sense line $S_2$ and the ground GND are electrically separated. When the selection signal is applied to the probe line $P_5$, since the selection switches $SQ_1$, $SQ_2$ are turned ON, the sense line $S_2$ and the ground GND are connected or separated electrically in accordance with "one" or "zero" level of the binary signals on the test points $TP_1$, $TP_2$.

By connecting the sense line $S_2$ to the constant-voltage supply source $V_c$ with a predetermined impedance, when the selection signal is applied to the probe line $P_5$, and of four current paths for flowing electric current on the sense line $S_2$ from the constant-voltage supply source $V_c$ through a resistor R are formed depending on combinations of the binary signal on the test points $TP_1$, $TP_2$. In order to make the magnitude of electric currents flowing on the four current paths different from each other, the W/L values of the electronic switches $EQ_1$, $EQ_2$ are set to be same value, and the W/L values of the selection switches $SQ_1$, $SQ_2$ are set to be different values from each other. In other words, the electric current flows from the constant-voltage supply source $V_c$ to the ground GND through one of the four different current paths corresponding to the four combinations of the binary signals on the test points $TP_1$, $TP_2$, respectively, that is, both binary signals on the test points $TP_1$, $TP_2$ are "zero" level, the binary signal on test point $TP_1$ is "one" level and the binary signal on test point $TP_2$ is "zero" level, the binary signal on test point $TP_1$ is "zero" level and the binary signal on test point $TP_2$ is "one" level, and both binary signals on the test points $TP_1$, $TP_2$ are "one" level, and therefore one of four state indicating analog signals is generated on an intersection $I_p$, where the sense line $S_2$ and the input terminal of the two-level quantization device $AD_2$ intersect each other, depending on the current path.

Denoting voltage levels of the four state indicating analog signals $V_{00}$, $V_{10}$, $V_{01}$ and $V_{11}$ corresponding to above-described four combinations of the binary signals on the test points $TP_1$, $TP_2$, the W/L values of the selection switches $SQ_1$, $SQ_2$ are set to be different values each other so as to satisfy a relation of $V_{00} > V_{10} > V_{01} > V_{11}$.

One of four state indicating analog signals corresponding to four combinations of the binary signals on the test points $TP_1$, $TP_2$ is fed to the two-level quantization device $AD_2$, then is converted into the same binary signals as the original binary signals on the test points $TP_1$, $TP_2$ by the two-level quantization device $AD_2$, and the reproduced binary signals are fed to the observation device OD through the output lines $K_1$, $K_2$.

Figure 5:
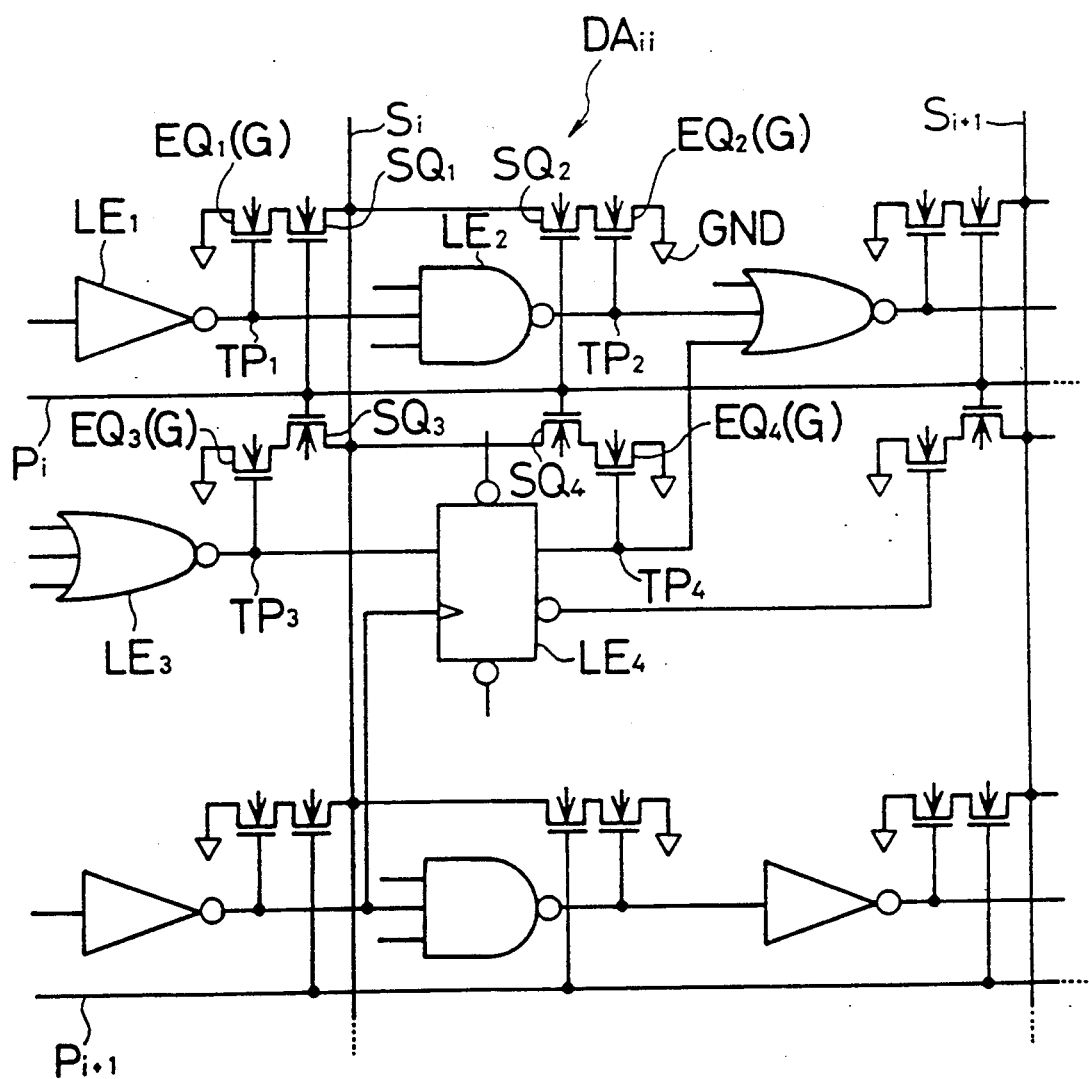
FIG. 5 is a circuit diagram showing an example of the electronic switch device.

Next, detailed descriptions will be made on an example showing logic elements LE of an integrated circuit IC, electronic switches DA, and test points TP with reference to FIG. 5. In the following descriptions, the number of the test points TP connected to each electronic switch group G is four.

In a vicinity of an intersection, where the sense line $S_i$ and the probe line $P_i$ intersect each other, INVERTER $LE_1$, NAND $LE_2$, NOR $LE_3$, and D type FLIP-FLOP $LE_4$ are disposed as a group of logic elements LE corresponding to the intersection. On output lines of the logic elements $LE_1 \sim LE_3$ and on a positive logic output line of the logic element $LE_4$, test points $TP_1 \sim TP_4$ are set, respectively, and electronic switches $EQ_1 \sim EQ_4$ as an electronic switch group G are connected to the test points $TP_1 \sim TP_4$, respectively.

Each of electronic switches $EQ_1 \sim EQ_4$ consists of an n-channel MOSFET, and the gates, sources, and drains of the electronic switches $EQ_1 \sim EQ_4$ are connected to the corresponding test points $TP_1 \sim TP_4$, a ground GND of the integrated circuit IC, and corresponding selection switches $SQ_1 \sim SQ_4$ each of which consists of an n-channel MOSFET, respectively. Gates and drains of the selection switches $SQ_1 \sim SQ_4$ are connected to the probe line $P_i$ and the sense line $S_i$, respectively.

By connecting the electronic switches $EQ_1 \sim EQ_4$ and the selection switches $SQ_1 \sim SQ_4$ in this manner, sixteen current paths for flowing electric current on the sense line $S_i$ from the constant-voltage supply source $V_c$ through a resistor R are formed depending on combinations of the binary signals on the test points $TP_1 \sim TP_4$. In order to make magnitude of the currents flowing on sixteen current paths different each other, the W/L values of the electronic switches $EQ_1 \sim EQ_4$ are set to be the same value and the W/L values of the selection switches $SQ_1 \sim SQ_4$ are set to be different values from each other.

By setting the W/L values of the electronic switches $EQ_1 \sim EQ_4$ and the selection switches $SQ_1 \sim SQ_4$ in this manner, state indicating analog signals, corresponding to the combinations of the binary signals on the test points $TP_1 \sim TP_4$ and being different in voltage levels from each other, can be generated on the sense line $S_i$.

As above-described, in the testing apparatus for the semiconductor integrated circuit IC according to the present invention, in the case where test points TP in the integrated circuit IC are arranged in a matrix of X rows and Y columns, the number of probe lines P and sense lines S can be remarkably reduced to X/P and to Y/q, respectively, by arranging the test points TP corresponding to each intersection in a matrix of p rows and q columns. Thus, a decrease of integration density of the integrated circuit IC due to a large number of probe lines P and sense lines S can be prevented, and the testing apparatus can be more practical and economical.

Figure 6:
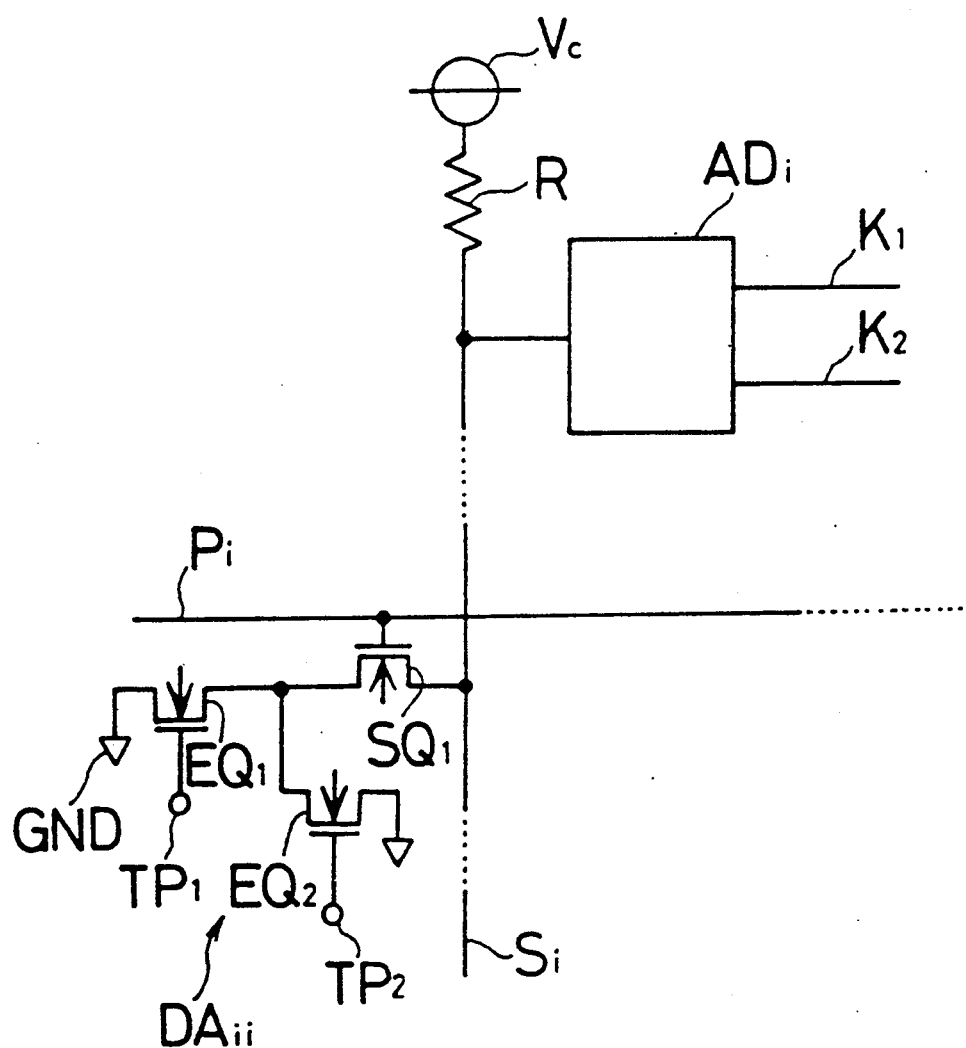
FIG. 6 is a circuit diagram showing the connection of another electronic switch device.

In a testing apparatus according to this modified embodiment, one selection switch SQ is incorporated in common with plural electronic switches EQ of an electronic switch device DA. As shown in FIG. 6, an electronic switch device $DA_{i\ i}$ comprises an electronic switch $EQ_1$ connected to a test point $TP_1$, an electronic switch $EQ_2$ connected to a test point $TP_2$, and one selection switch $SQ_1$ connected to the electronic switches $EQ_1$, $EQ_2$. W/L values of the electronic switches $EQ_1$, $EQ_2$ are set to be different. In this electronic switch device $DA_{i\ i}$, one of four state indicative analog signals corresponding to four combinations of binary signals on the test points $TP_1$, $TP_2$ can be generated on the sense line $S_i$, similarly to above-described embodiment, and the number of selection switches SQ included in the electronic switch device $DA_{i\ i}$ can be reduced.

Figure 7:
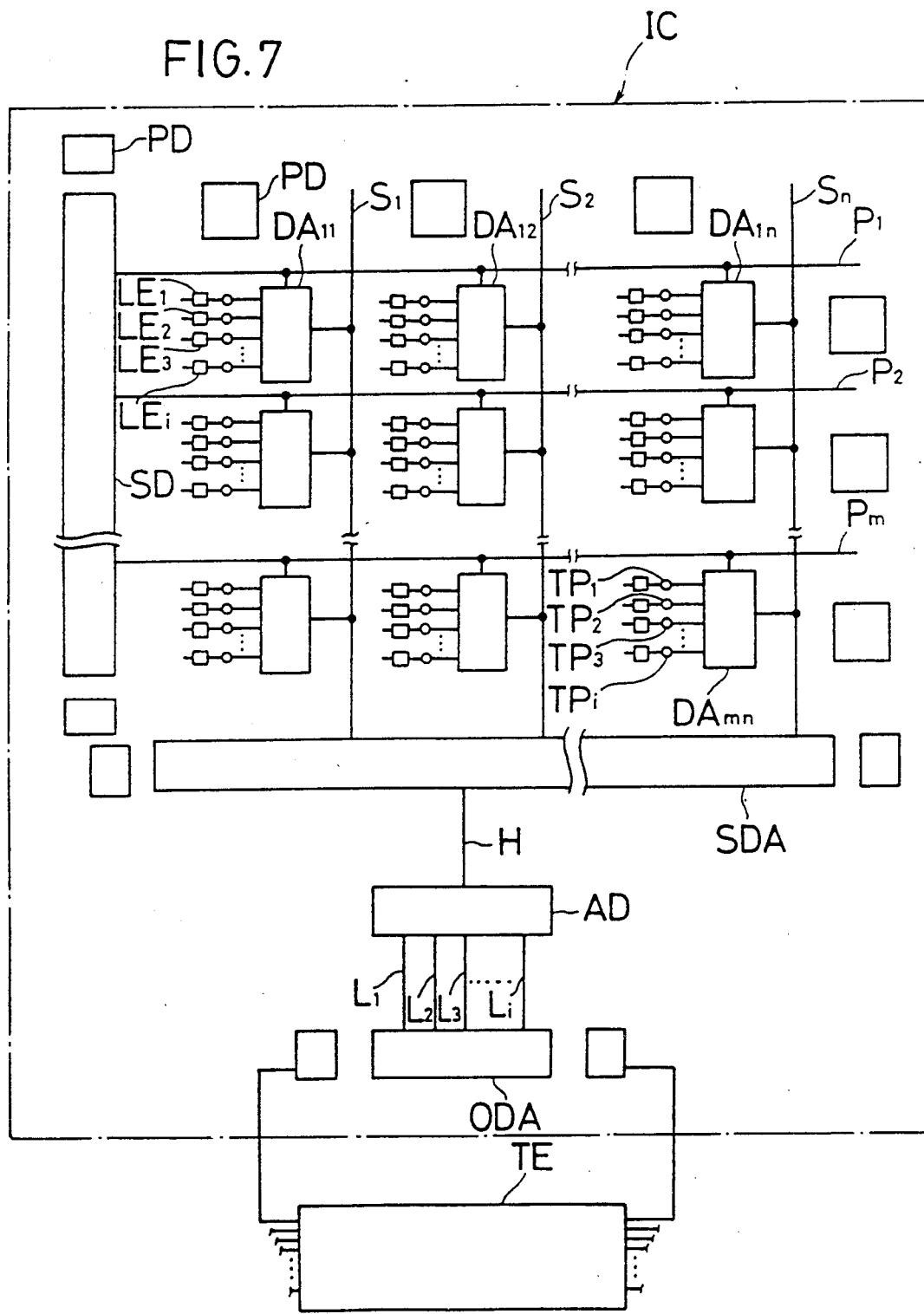
FIG. 7 is a diagram showing basic configuration of another testing apparatus for a semiconductor integrated circuit.

In a testing apparatus according to FIG. 7, one two-level quantization device AD is provided in common with the sense lines S.

A selection device SDA consisting of analog switches is connected to sense lines S incorporated in an integrated circuit IC. The two-level quantization device AD is connected to the selection device SDA through a line H, and also connected to an observation device ODA through output lines $L_1 \sim L_1$, of which the number of lines is same as that of test points TP connected to an electronic switch device DA.

State indicating analog signals fed to the sense lines by applying a selection signal in sequence to probe lines P from a selection device SD, are fed to the two-level quantization device AD through the selection device SDA in sequence by each sense line S, then the state indicating analog signals are converted into the same binary signals as the original binary signals by the two-level quantization device AD, and the reproduced binary signals are fed to the observation device ODA through the output lines $L_1 \sim L_1$.

According to this testing apparatus, the two-level quantization device AD and observation device ODA can be reduced in size, and number of lines for connecting the two-level quantization device AD and the observation device ODA can be reduced. Additionally, it is possible to carry out the testing more speedily by providing the selection device SDA with synthesizing functions for synthesizing the state indicating analog signals on sense lines S.

Furthermore, p-channel MOSFETs can be used for electronic switches EQ and selection switches SQ as can bipolar transistors, Josephson devices, and GaAs devices.

In the first and second embodiments, W/L values of the electronic switches EQ are set to be same value and W/L values of selection switches SQ are set to be different values each other, however, it is possible that W/L values of the electronic switches EQ are set to be different values each other and W/L values of the selection switches SQ are set to be the same value. It is also possible that W/L values in combinations of the electronic switches EQ and the selection switches SQ are set to be different values from each other. In addition, it is possible to observe state indicating analog signals generated on the sense lines S or to apply a selection signal to probe lines P with laser beams or electron beams. Furthermore, the testing apparatus according to the present invention is also applicable to test various custom semiconductor integrated circuits.

What is claimed is:

1. A method for obtaining binary signals for test points in a semiconductor integrated circuit for testing the semiconductor integrated circuit through probe lines and sense lines intersecting the probe lines approximately at right angles, which probe lines and sense lines are incorporated in the semiconductor integrated circuit, comprising the steps of;
   (a) providing plural electronic switch devices in the integrated circuit so that the electronic switch devices correspond to plural intersections where the probe lines and sense lines intersect each other so as to be capable of feeding signals to corresponding sense lines in response to selection signals applied to corresponding probe lines, each of the electronic switch devices comprising electronic switches which are connected to test points in the integrated circuit and connected to a corresponding sense line and a corresponding probe line;
   (b) applying a selected signal of test pattern signals to input terminals of logic elements in the integrated circuit;
   (c) applying a selection signal to a selected one of the probe lines;
   (d) generating from each of the electronic switch devices corresponding to the selected probe line one of plural state indicating analog signals, each of which corresponds to a combination of binary signals on its corresponding test points;
   (e) converting each of the state indicating analog signals generated on the sense lines into binary signals corresponding to the combination of the binary signals on corresponding test points and then feeding the converted binary signals;
   (f) repeating steps (c) to (e) after selecting another one of the probe lines; and
   (g) repeating steps (b) to (f) after selecting another one of the test patter signals.

2. An apparatus for testing a semiconductor integrated circuit through probe lines and sense lines intersecting the probe lines approximately at right angles, which are incorporated in the semiconductor integrated circuit, comprising;
   a selection means for applying a selection signal to one of the probe lines in sequence;
   state indicating analog signal generating means including electronic switch devices incorporated in the integrated circuit so that the electronic switch devices correspond plural intersections where the probe lines and sense lines intersect each other, the electronic switch devices being operatively arranged to feed signals to corresponding sense lines in response to selection signals applied to corresponding probe lines and, each of the electronic switch devices comprising electronic switches which are connected to test points in the integrated circuit and connected to a corresponding sense line and a corresponding probe line;
   wherein said state indicating analog signal generating means, for generating state indicating analog signals, each of which correspond to combinations of binary signals on the test points connected to the electronic switches of each corresponding electronic switch device, to a corresponding sense line in cooperation with the corresponding electronic switch device; and
   two-level quantization means, each of which is for converting each state indicating analog signal generated on the sense line, into reproduced binary signals corresponding to the combination of the binary signals on corresponding test points.

3. An apparatus for testing a semiconductor integrated circuit according to claim 2, wherein each electronic switch device further comprises selection switches disposed between each electronic switches and a corresponding sense line, and the selection switches are turned on in response to the selection signal.

4. An apparatus for testing a semiconductor integrated circuit according to claim 3, wherein each of the selection switches and electronic switches of each electronic switch device is constituted with an n-channel MOSFET, a gate of each selection switch is connected to a corresponding probe line, a drain of each selection switch is connected to a corresponding sense line, a gate of each electronic switch is connected to a corresponding test point, a drain of each electronic switch is connected to a source of a corresponding selection switch, and a source of each electronic switch is connected to a ground of the integrated circuit.

5. An apparatus for testing a semiconductor integrated circuit according to claim 4, wherein each of the state indicating analog signal generating means comprises a constant voltage supply source of the integrated circuit which is connected to the sense line through a resistor, a ground of the integrated circuit which is connected to the sources of the electronic switches of the electronic switch device and wherein at least one of W/L values of the electronic switches of the electronic switch device and W/L values of the selection switches connected to the electronic switches are made different from each other.

6. An apparatus for testing a semiconductor integrated circuit according to claim 5, wherein each of the two-level quantization means connected to respective ones of the sense lines comprises an A/D converter.

7. An apparatus for testing a semiconductor integrated circuit according to claim 6, wherein the selection means includes a shift register capable of applying the selection signal selectively to one of the probe lines.

8. An apparatus for testing a semiconductor integrated circuit according to claim 7, further comprising an observation means for receiving output signals fed from each of the two-level quantization means connected to respective sense lines, the observation means including a shift register for storing temporarily the output signals fed from each of the two-level quantization means.

9. An apparatus for testing a semiconductor integrated circuit according to claim 3, wherein each of the selection switches and electronic switches of the electronic switch device include a p-channel MOSFET, a gate of each selection switch is connected to a corresponding probe line, a drain of each selection switch is connected to a corresponding sense line, a gate of each electronic switch is connected to a corresponding test point, a drain of each electronic switch is connected to a source of a corresponding selection switch, and a source of each electronic switch is connected to a constant-voltage supply source of the integrated circuit.

10. An apparatus for testing a semiconductor integrated circuit according to claim 2, wherein each of the electronic switch devices comprises one selection switch disposed in common between the electronic switches and a corresponding sense line and the selection switch is turned on in response to the selection signal.

11. A method for obtaining binary signals for test points in a semiconductor integrated circuit for testing the semiconductor integrated circuit through probe lines and sense lines arranged approximately at right angles to the probe lines comprising the steps of;
   (a) applying selection signals to corresponding probe lines;
   (b) providing electronic switch devices in the integrated circuit in correspondence with the approximately right angle arrangements of the probe lines and sense lines for feeding signals to corresponding sense lines in response to the applied selection signals;
   (c) applying a selected signal of test pattern signals to the integrated circuit;
   (d) applying a selection signal to the selected on of the probe lines;
   (e) generating from each of the electronic switch devices corresponding to the selected probe line, one of plural state indicating analog signals, each of which corresponds to a combination of binary signals on a corresponding test point; and
   (f) converting each of the state many indicating analog signals generated on the sense lines into binary signals corresponding to the combination of the binary signals on corresponding test points.

12. An apparatus for testing a semiconductor integrated circuit through integrated probe lines and sense lines arranged at approximately right angles of the probe lines, which are incorporated in the semiconductor integrated circuit, comprising;
   a selection device to apply sequentially a selection signal to the probe lines; means for generating state indicating analog signals including integrated electronic switch devices corresponding with selection locations of respective probe lines and sense lines for feeding signals to corresponding sense lines in response to selection signals applied to corresponding probe lines, and each switch device comprising plural electronic switches connected to plural test points in the integrated circuit and to corresponding sense lines and probe lines;
   said means for generating state indicating analog signals corresponding to a combination of binary signals on the test points connected to the electronic switches of each electronic switch device for a corresponding sense line and
   means for converting each of the state indicating analog signals into reproduced binary signals.

13. A method for testing the semiconductor integrated circuit through probe lines and sense lines intersecting the probe lines approximately at right angles, which probe lines and sense lines are incorporated in the semiconductor integrated circuit, comprising the steps of;
   (a) providing plural electronic switch devices in the integrated circuit so that the electronic switch devices correspond to plural intersections where the probe lines and sense lines intersect each other so as to be capable of feeding signals to corresponding sense lines in response to selection signals applied to corresponding probe lines, each of the electronic switch devices comprising electronic switches which are connected to test points in the integrated circuit and connected to a corresponding sense line and a corresponding probe line;
   (b) applying a selected signal of test pattern signals to input terminals of logic elements in the integrated circuit;
   (c) applying a selection signal to a selected one of the probe lines;
   (d) generating from each of the electronic switch devices corresponding to the selected probe line one of plural state indicating analog signals, each of which corresponds to a combination of binary signals on its corresponding test points;
   (e) converting each of the state indicating analog signals generated on the sense lines into binary signals corresponding to the combination of the binary signals on corresponding test points and then feeding the converted binary signals to an electronic apparatus for testing the semiconductor integrated circuit, and then analyzing the logic elements corresponding to the selected probe line with the use of a plurality of the converted binary signals;
   (f) repeating steps (c) to (e) after selecting another one of the probe lines; and
   (g) repeating steps (b) to (f) after selecting another one of the test patter signals.

* * * * *